US008138868B2

(12) United States Patent
Arnold

(10) Patent No.: US 8,138,868 B2
(45) Date of Patent: Mar. 20, 2012

(54) METHOD AND STRUCTURE FOR MAGNETICALLY-DIRECTED, SELF-ASSEMBLY OF THREE-DIMENSIONAL STRUCTURES

(75) Inventor: David Patrick Arnold, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 882 days.

(21) Appl. No.: 12/102,758

(22) Filed: Apr. 14, 2008

(65) Prior Publication Data
US 2008/0218299 A1 Sep. 11, 2008

Related U.S. Application Data

(63) Continuation-in-part of application No. PCT/US2006/045633, filed on Nov. 28, 2006.

(60) Provisional application No. 60/740,139, filed on Nov. 28, 2005.

(51) Int. Cl.
*H01F 7/00* (2006.01)
*H01F 1/00* (2006.01)
*B23P 19/00* (2006.01)

(52) U.S. Cl. ........ 335/219; 335/285; 335/295; 335/296; 335/302; 335/306; 29/729; 29/744; 29/832

(58) Field of Classification Search .................. 335/214, 335/219, 225, 228–230, 234, 250, 262, 274, 335/275, 284–296, 302–306; 29/DIG. 46, 29/743, 744, 592.1, 832, 729
See application file for complete search history.

(56) References Cited

U.S. PATENT DOCUMENTS

| 3,228,133 | A |   | 1/1966  | Baermann |             |
|-----------|---|---|---------|----------|-------------|
| 3,439,416 | A |   | 4/1969  | Yando    |             |
| 5,355,577 | A | * | 10/1994 | Cohn ........................... | 29/592.1 |
| 5,428,331 | A | * | 6/1995  | Graner et al. ................ | 335/285  |
| 5,596,304 | A | * | 1/1997  | Tatchyn ....................... | 335/306  |
| 6,653,919 | B2| * | 11/2003 | Shih-Chung et al. ......... | 335/207  |
| 6,780,696 | B1| * | 8/2004  | Schatz ......................... | 438/216  |
| 6,929,291 | B2| * | 8/2005  | Chen .......................... | 292/251.5|

(Continued)

FOREIGN PATENT DOCUMENTS
WO    WO 2005/089184    9/2005

(Continued)

OTHER PUBLICATIONS

Sharma, G. et al., "Cross Scale Self-Assembly Using Magnetic Nanostructures", presentation given at the Institute of Microelectronics, Singapore for the 3$^{rd}$ Annual Foundations of Nanoscience conference, Apr. 23-27, 2006.

(Continued)

*Primary Examiner* — Mohamad Musleh
(74) *Attorney, Agent, or Firm* — Saliwanchik, Lloyd & Eisenschenk

(57) ABSTRACT

A magnetically directed, self-assembled structure has a first body. The first body includes a single magnet or plurality of magnets disposed thereon to form a spatially variable magnetic field in a first predetermined pattern. A second body has a single magnet or plurality of magnets disposed thereon to form a spatially variable magnetic field in a second predetermined pattern. The second predetermined pattern is complementary to the first pattern. The first body is attracted to the second body with an attractive force greater than a mixture force such that the first body and second body are fully aligned to each other and bonded together.

80 Claims, 13 Drawing Sheets

U.S. PATENT DOCUMENTS

| | | | |
|---|---|---|---|
| 7,251,882 B2 * | 8/2007 | Ricks et al. | 29/832 |
| 7,629,026 B2 * | 12/2009 | Sharma et al. | 427/256 |
| 7,644,489 B2 | 1/2010 | Arora et al. | |
| 2002/0130311 A1 | 9/2002 | Lieber et al. | |
| 2002/0147026 A1 * | 10/2002 | Hsieh | 455/550 |
| 2003/0234401 A1 | 12/2003 | Fonstad et al. | |
| 2005/0194384 A1 * | 9/2005 | Petit | 220/230 |
| 2006/0133625 A1 * | 6/2006 | Adams et al. | 381/120 |
| 2006/0214756 A1 * | 9/2006 | Elliott et al. | 335/306 |
| 2007/0103266 A1 * | 5/2007 | Wang et al. | 335/285 |

FOREIGN PATENT DOCUMENTS

| | | |
|---|---|---|
| WO | WO 2006/096378 A1 | 9/2006 |

OTHER PUBLICATIONS

Bowers, B. J., et al., "A Method to Form Bonded Micromagnets Embedded in Silicon", Tech. Dig. 14th Int. Conf. Solid-State Sensors, Actuators, and Microsystems (Transducers '07), Lyon, France, Jun. 2007, vol. 2, pp. 1581-1584.

Wang, N., et al., "Wax-Bonded NdFeB Micromagnets for Microelectromechanical Systems Applications", J. Appl. Phys., vol. 103, No. 7, pp. 07E109-107E109-3, Apr. 2008.

Shetye, S., et al., "Magnetic Self-Assembly of Millimeter Scale Components," Proceedings of 2008 NSF Engineering Research and Innovation Conference, Knoxville, TN, Jan. 7-10, 2008.

* cited by examiner

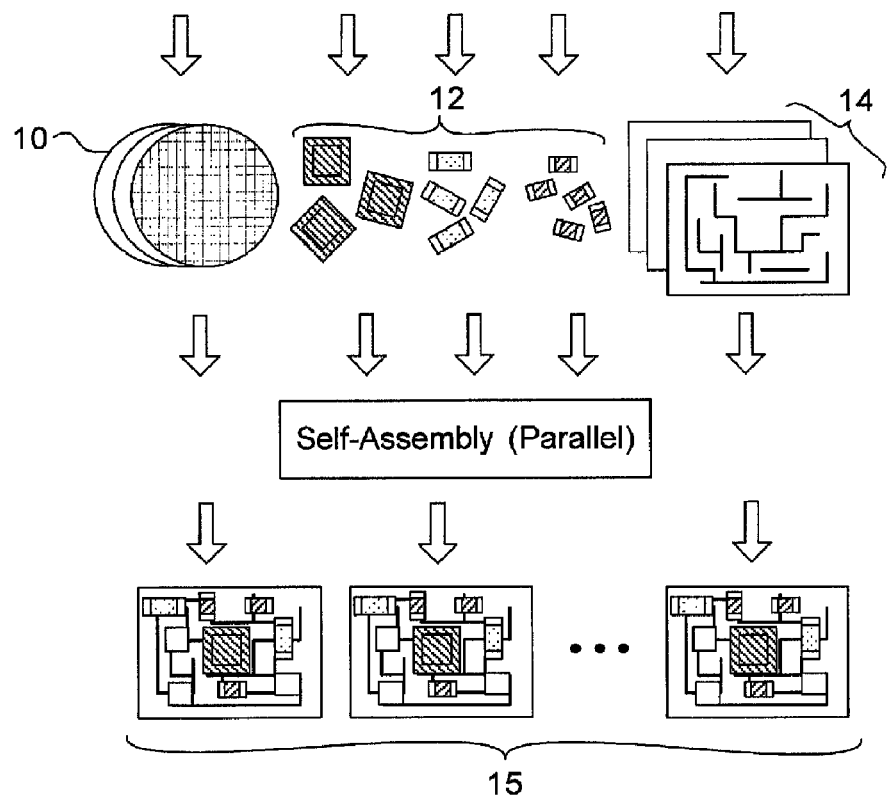
FIG. 1B
(Prior Art)
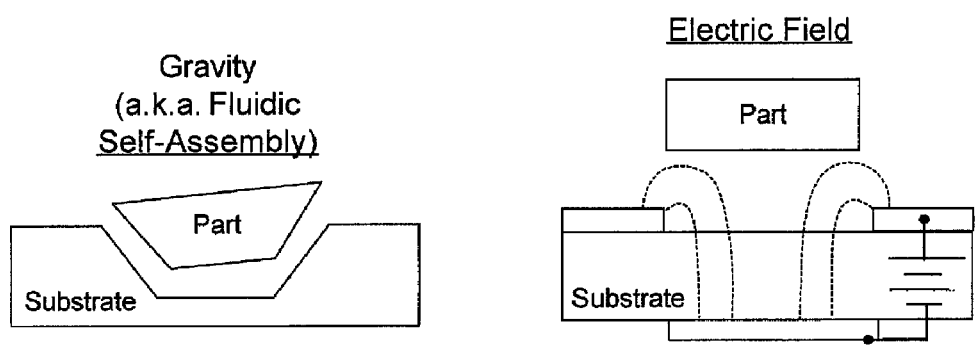
FIG. 2A
(Prior Art)
FIG. 2B
(Prior Art)

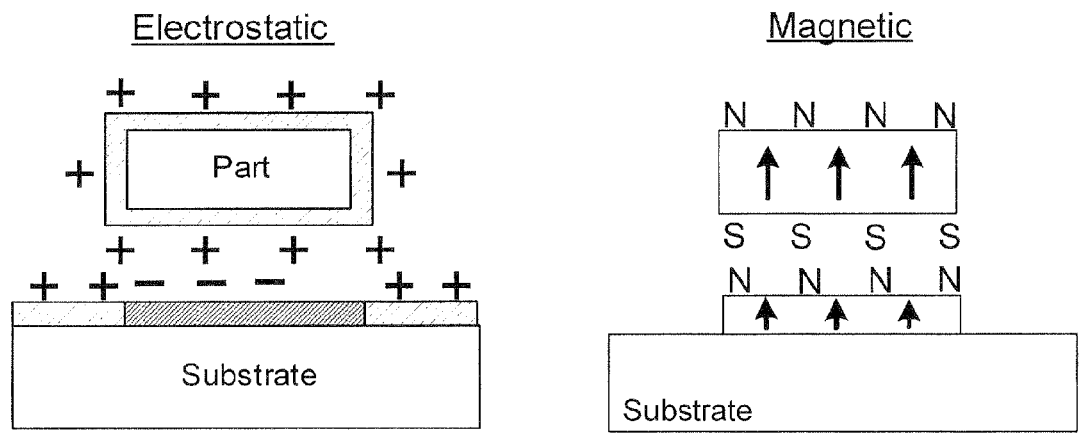
FIG. 2C
(Prior Art)
FIG. 2D
(Prior Art)
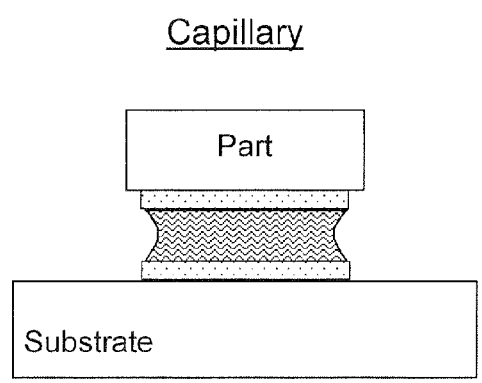
FIG. 2E
(Prior Art)

METHOD AND STRUCTURE FOR MAGNETICALLY-DIRECTED, SELF-ASSEMBLY OF THREE-DIMENSIONAL STRUCTURES

CROSS-REFERENCE TO RELATED APPLICATIONS

This application is a continuation-in-part of International Patent Application No. PCT/US2006/045633, filed Nov. 28, 2006, which claims the benefit of U.S. Provisional Patent Application Ser. No. 60/740,139, filed Nov. 28, 2005, the disclosures of which are hereby incorporated by reference in their entirety.

GOVERNMENT SUPPORT

This work was supported in part from National Science Foundation Grant Nos. ECCS-0716139 and DMI-0556056. The government has certain rights to this invention.

BACKGROUND OF THE INVENTION

This invention is directed to the self-assembly of three-dimensional structures, and more particularly, to the self-assembly of three-dimensional structures for integrated circuits utilizing shaped magnetic fields.

Over the past few decades, advances in the field of electronic and photonic devices for signal processing wireless communication, computing and the like have become more complex as they become more highly integrated. Most systems are an amalgam of heavily integrated microsystems. These systems are enabled by careful integration of sub-systems of various physical size and function into compact modular devices. By way of example, the cellular phone tightly integrates CMOS electronics, RF components, photonics, micro-electro-mechanical systems (MEMS), passive discrete components, power supplies and circuit boards to enable wireless communication, data processing/storage and signal processing functionalities. The trend is for smaller, more compact, more integrated and more complex devices.

It is currently known in the art to create these devices by separately fabricating each of the components, through mutually incompatible processes, and then assembling into the sub-assemblies. For example, the semiconductor devices are batch fabricated using wafers having hundreds or thousands of individual components.

Reference is made to FIG. 1A in which a schematic of a known assembly process is shown. Semiconductor devices are batch fabricated using wafers 10. After microfabrication, the wafers are diced and possibly packaged into subcomponents 12. In parallel with the semiconductor processing, passive electrical components such as capacitors, inductors, and resistors, as well as circuit boards 14 are fabricated. After individual fabrication, all of the system subcomponents are assembled serially onto the circuit boards utilizing human manipulation, or more commonly robotic "pick and place" systems to form the completed electrical circuit board 15. This method has been satisfactory; however, it suffers from the disadvantage that the large number of components that can be batch manufactured overwhelm the throughput capabilities for the serial back-end packaging and assembly. Because of the serial nature, the throughput is limited by the number and speed of the robotic manipulators. Secondly, the shrinking physical size of the microelectronics, down to the micro- or nanoscale in many applications, requires precise manipulation. As components become smaller, the absolute alignment positioning tolerances scale equivalently; sometimes beyond the capabilities of robotic manipulation.

Lastly, for sub-millimeter parts, the adhesion forces between the part and the manipulator are significant compared to gravity, resulting in a sticking problem.

Self-assembly has been utilized to a small extent during the packaging and preparation process when forming components onto substrates. Self-assembly is the autonomous organization of components into patterns or structures without human intervention. It is the assembly of parts onto a fixed substrate or the assembly of homogeneous or heterogeneous mixtures of parts one to another. The process is inherently stochastic, relying on the random distribution, mixing and physical interactions between the parts.

The self-assembly processes are governed by two fundamental forces, one being played against the other. Namely, the two forces are the mixing forces causing the large-scale mechanical movement between the parts to be assembled and short-range bonding forces causing the parts to assemble to one another when in close proximity. To maintain a bond, the short range bonding force must be greater than the mixing force to provide a stable connection. The short range bonding force must also be sufficient to overcome other external forces that may act to separate the parts, such as gravity, surface tension, buoyancy, electrostatic forces or the like. Alignment of the parts in self-assembly is typically dependent on minimization of the total free energy.

It is also known in the art to effect mixing by fluid flow (typically for wet assembly) or by vibration energy (typically for dry assembly). Short-range bonding forces have taken the forms of gravity, electrostatic forces, magnetic forces, and capillary forces (as seen in FIG. 2). It should be noted that the forces need merely be sufficient to temporarily hold two pieces of interest together even in the presence of the mixing forces. Once the parts have been assembled, permanent, mechanical and electrical connections can be made through the curing of polymer-based adhesives or reflowing of solder bumps.

More particularly, it is known to use electrostatic forces to more efficiently direct and hold one part to another. In one prior art embodiment, pattern electrodes have been formed on the surface of at least one of the parts to create electric field traps to capture and surface mount components and LEDs on silicon substrates. This method has been satisfactory; however, it requires the formation of an electrical circuit in a desired pattern on the substrate. This adds complexity to the structure of a substrate, is often substrate-limited, i.e., is too difficult to use between two free-floating bodies, and requires the input of energy.

One way of overcoming this shortcoming is to create direct forces between the component and the substrate such as magnetic forces. It is known in the art to use magnetic forces to self-assemble 50 µm nickel disks coated with immobilized biomaterials into an array of nickel disk pattern on the substrate. However, in the prior art, the magnetic forces were the result of the entire structure being a magnet where the structures were attracted to each other, but there is no control over selectivity, or interaction. Furthermore, the magnetic approach was also limited to substrate bonding, not to free floating bodies.

To overcome the shortcomings of these self-assembly structures and methods, capillary forces have also been used to drive self-assembly. At small scales, the capillary forces become dominant. The hydrophilicity of various regions of a surface is controlled to pattern liquid films on a substrate. When a hydrophilic contact pad on one side of a part comes in contact with a liquid droplet, the pad spontaneously wets, and capillary forces draw the part into alignment, thereby minimizing the fluidic interfacial surface energy. This technique has come into vogue to assemble small parts onto planar surfaces with submicron precision for micromirror arrays, inductors and micropumps by way of example.

These techniques and methods for manufacture have been satisfactory; however, they do not match the full functionality offered by robotic or human part manipulation such as orientational uniqueness, bonding selectivity, or inter-part bonding. As a result, they limit the basic logical design rules available for a designer in the self-assembly process.

To provide orientational uniqueness, the method must restrict part bonding to a unique physical orientation between the two bodies to be bonded. As a result, process yield is improved by minimizing the number of misaligned, misfit or incorrectly bonded (e.g., upside down) bonds. Orientational uniqueness is necessary to ensure physically symmetric parts are bonded in the desired orientation to allow complex mating of interconnecting structures.

In the prior art, bonding forces would be sufficient to dominate the mixing forces even if incorrectly aligned. In other words, certain incorrect orientations may result in a local minimization of energy, and the mixing energy is insufficient to move the part into the desired orientation to achieve the global energy minimum. Furthermore, for bonding approaches that have geometric symmetry, energy minimization may occur even in more than one physical orientation.

The gravity driven self-assembly process has attempted to overcome this issue. This is done by giving a specific shape to the receptor site hole. However, these approaches require parts with large scale asymmetrical physical geometries, adding cost and complexity to the batch manufacture process. In the capillary driven self-assembly method, asymmetric bonding interfaces have been implemented, but the alignment precision decreased and the process yields dropped by nearly 70%. The drop in yield is attributed to local energy minima creating misfits and the reduced precision was attributed to a less sharp dip in the energy curve.

The self-assembly method must also lend itself to bonding selectivity, i.e., that the desired part bond with its intended mating part, but not with a third unintended part. Each of the gravity, electrostatic, electric field trap, and capillary methods can be adapted to provide bonding selectivity based on geometric shape, electromagnetic properties, surface and hydrophilicity between the parts.

By way of example, for capillary driven assembly methods, a method has been developed for activating or deactivating certain receptor sites for the self-assembly of different components using sequential steps. Although allowing bonding selectivity, it requires substantial processing and precludes parallel assembly of heterogeneous mixtures. Furthermore, this sequential process lengthens the assembly process as a function of the number of different components.

For a gravity driven self-assembly, shape-matching techniques have been used to effect bonding selectivity for parallel self-assembly of a heterogeneous mixture of three different parts. It is comparable to the approach of a square block, which will not fit, into the proverbial circular hole. However, the number of mutually exclusive shapes may be limited and chip real estate may be wasted as a result of the need for size differentiation as one shape differentiator. Furthermore, the machining of arbitrarily shaped parts imposes additional processing complexity and cost. Therefore, the prior art provides no real solution for the bonding selectivity issue and the requirement in more complex applications for sequential selective bonding in a parallel process.

A self-assembly process should also enable inter-part bonding, namely that free floating parts bond to other free floating parts, rather than to fixed substrates. With respect to inter-part bonding, the electric field method becomes inapplicable with its requirement of the application of an electric charge to at least one of the bodies.

Inter-part bonding further requires the ability to bond in any arbitrary direction. Because of this, gravity-driven processes are inapplicable because gravity only acts in one direction. A collection of free floating parts would have no driving force to bond to one another unless oriented so that gravity is in the direction of at least one of the parts. As a result, short-range bonding forces must exist intrinsically between the parts, not from some externally applied source.

A secondary challenge for inter-part bonding is preventing agglomeration, where parts of a similar type inadvertently bond to each other rather than to the specified receptor site. As a result, capillary-driven assembly is inapplicable because agglomeration requires that there are no short range bonding forces between similar parts, while insuring there are bonding forces between dissimilar parts. If parts of a first type must have a wetted receptor, they will agglomerate to each other while the "dry" second type would not agglomerate.

For a capillary-driven self-assembly approach, it has been demonstrated that a two-step sequential self-assembly of encapsulated LED structures using shape- and solder-directed processes of free floating parts may overcome the inter-part bonding issue. The agglomeration problem is overcome by recessing the wetted receptor sites and cavities and limiting access to only the smaller parts that are intended to be bonded. Solder may also be used as the bonding liquid in a way that solid solder bumps are patterned at the wafer level and heated to melt to form wetted contacts on each of the individual components. When cooled, the solder also serves as the permanent electrical and mechanical contact. This process has been shown to have potential to be satisfactory, however, it suffers from the drawback that it requires sequential assembly steps and the limitation of a single electrical contact between the individual parts and the requirement for parts of dissimilar size to prevent agglomeration.

Accordingly, a method and structure for overcoming the shortcomings of the prior art and allowing self-assembly between two bodies while providing orientational uniqueness, bonding selectivity and inter-part bonding is desired.

BRIEF SUMMARY OF THE INVENTION

In order to effect self-assembly, a first body is provided with a single magnet or plurality of magnets disposed on the body to form a spatially varying magnetic field in a first predetermined pattern. In an embodiment, the magnets are of a first polarity. A second body has a single magnet or plurality of magnets disposed on the body to form a spatially varying magnetic field in a second pattern, which is complimentary to the first pattern. In an embodiment, the second pattern is the mirror image of the first pattern.

The magnet or magnets of the second body may either be magnetically hard, having a magnetic polarity opposite to the polarity of the first magnet or magnets, or may be magnetically soft in which it becomes magnetized in the presence of the magnetic field from the first pattern. A magnetically hard magnet, or permanent magnet, has a permanent magnetic polarization. A magnetically soft magnet, or soft magnet, becomes magnetized, and exhibits a magnetic field, in the presence of another magnetic field. The size and arrangement of the first pattern and second pattern being sufficient so that when the first pattern is in close proximity to the second pattern, and substantially aligned, the attraction force between the first magnetic field pattern and the second magnetic field pattern is sufficient to overcome a mixing force. The magnetic attraction force resulting from the interaction of the first magnetic field and the second magnetic field aligns the two bodies and bonds the two bodies. Full alignment of the two bodies with respect to each other results in an energy minimum, resulting in a stable physical orientation.

In one embodiment of the invention, a plurality of magnets is formed in at least one of the first body or second body. In another embodiment, a single magnet with a specific physical shape is formed in at least one of the first body or second body. In a third embodiment, one or more magnetic regions on the first body and/or second body are spatially magnetized to form the first or second shaped magnetic field pattern. In an embodiment, the orientation of the first magnetic field pattern relative to the second magnetic field pattern causes the first body to be uniquely oriented and bonded to the second body.

During use, a first body is formed with a single magnet or plurality of magnets disposed to produce a first magnetic field having a first predetermined pattern. A second body is formed with a single magnet or plurality of magnets to produce a second pattern complimentary to the first pattern. The first body and second body are mixed together. The first body being attracted to the second body when in sufficient proximity for an attraction between the first shaped magnetic field pattern to the second shaped magnetic field pattern to overcome a mixing force. The attraction between the first shaped magnetic field pattern and second shaped magnetic field pattern overcomes the mixing force when the first pattern substantially aligns with the second pattern. The full alignment of the first body and the second body results in an energy minimization and a stable bonding arrangement.

The magnet(s) can be formed in the first body and/or second body by performing an electrodeposition process where the micro-magnets are patterned generally through photolithography. According to an embodiment utilizing an electrodeposition process, a conductive seed layer can be deposited on a substrate. Small geometric shapes, having a height in the micrometer to millimeter range, can be patterned into a photoresist layer serving as the electroplating mold. Then, magnetic materials can be electroplated into the mold formed by the patterned photoresist layer. The mold and seed layer can then be removed by, for example, wet etching.

According to another embodiment, micromagnetic structures can be fabricated embedded in a substrate. In one embodiment, a photoresist can be coated on a substrate and patterned to define trenches. A deep reactive ion etch can be performed using the patterned photoresist to pattern trenches into the wafer's surface. The trenches are etched to a depth corresponding to a height of the embedded magnet. The trenches can then be packed with magnetic powder. The magnetic powder can be packed into the trenches with compression by wiping a flat edge across the wafer. A protective layer can be formed on the packed trenches, or alternatively, wax particles can be included in the magnetic powder and the substrate can be heated to melt the wax particles.

In other embodiments, other deposition techniques, such as sputtering, pulsed-laser deposition, evaporation, or other film deposition techniques can be used to fabricate the magnets on or recessed in the surface of the substrate.

BRIEF DESCRIPTION OF THE DRAWINGS

For a fuller understanding of the invention, reference is had to the following description taken in connection with the accompanying drawings in which:

FIG. 1B is a schematic diagram of a method for parallel self-assembly in accordance with the prior art;

FIGS. 2A-2E are schematic diagrams of prior art self-assembly methods for components on a substrate;

DETAILED DESCRIPTION OF THE INVENTION

Figure 1A:
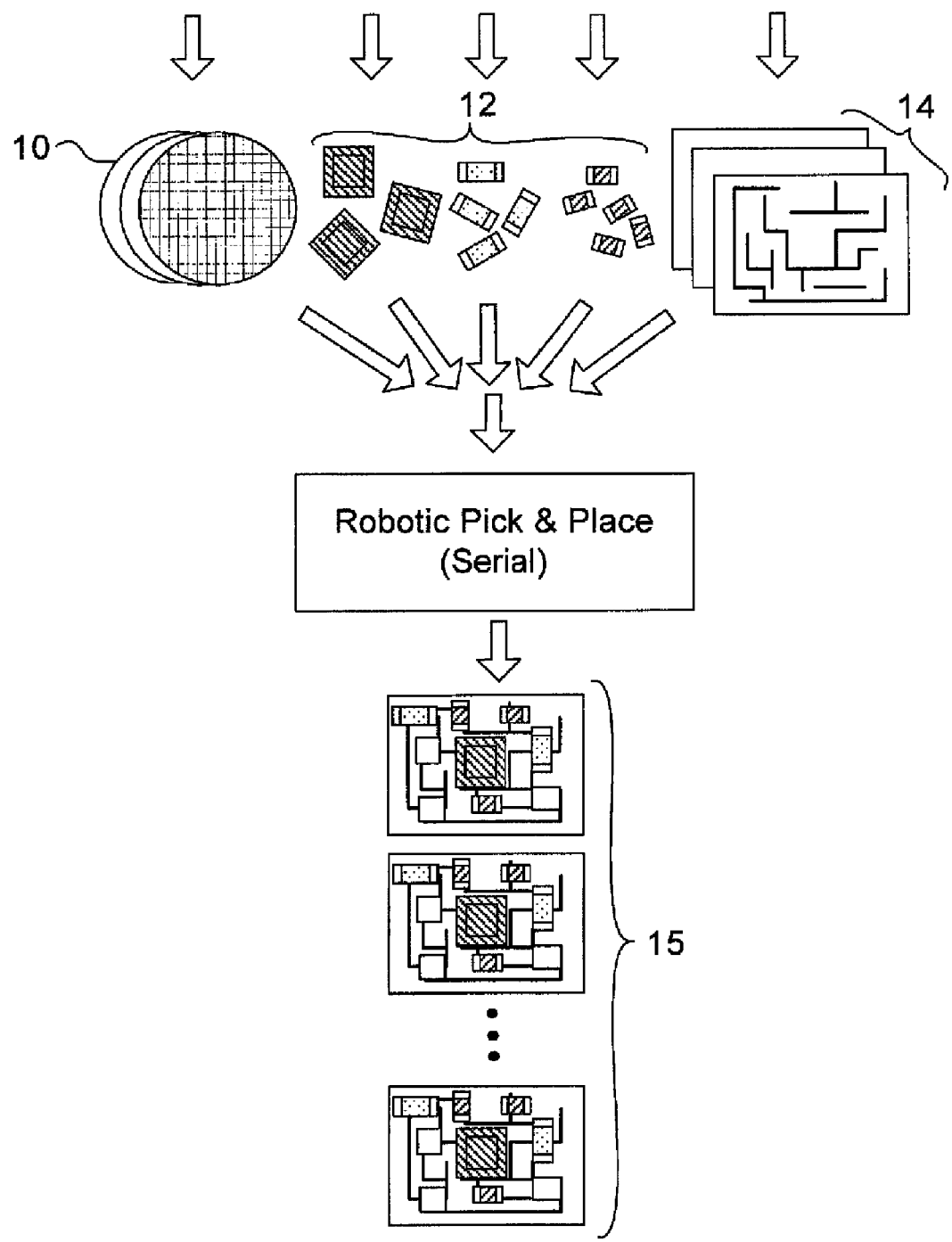
FIG. 1A is a schematic diagram of a method for serial robotic self-assembly of sub-components in accordance with the prior art.
Figure 3:
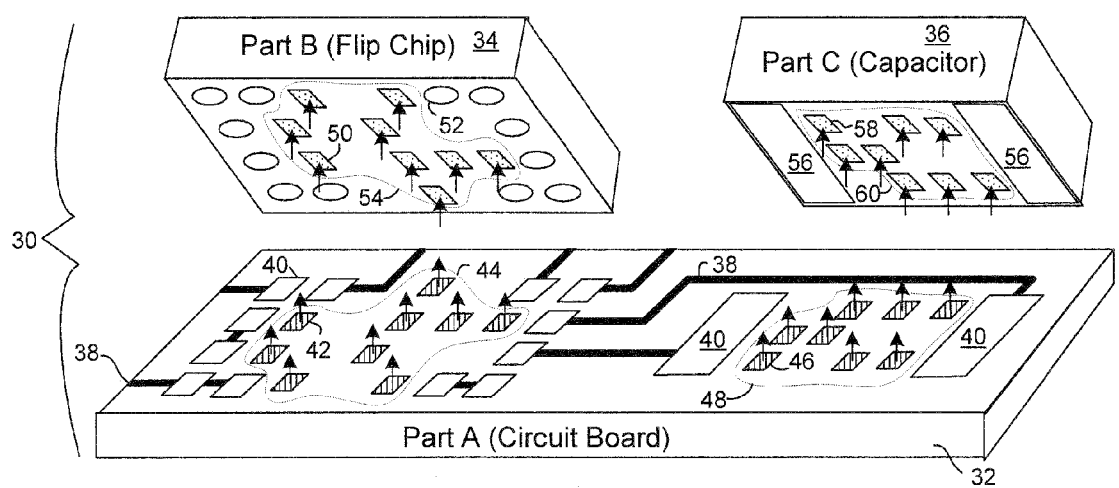
FIG. 3 is an exploded perspective view of a self-assembled circuit constructed in accordance with the invention.

Reference is now made a specific embodiment, shown in FIG. 3, in which an assembly, generally indicated as 30, includes a first member 32, a second member 34 and a third member 36. First member 32 is a printed circuit board; the circuit having a generic flip chip circuit and capacitor by way of example mounted thereon. Circuit board 32 is provided with circuit structure including wiring or trace leads 38 conductively coupled to solder bumps 40 to allow electrical connection with other members 34, 36. Circuit board 32 (interchangeably referred to as first member 32) includes a first plurality of magnets 42 arranged in a pattern 44 to provide a shaped magnetic field. Circuit board 32 also includes a second plurality of magnets 46 arranged in a second pattern 48.

Second member 34, in this embodiment a flip chip, is formed with a plurality of magnets 50 thereon and solder bumps 52. Magnets 50 are provided in a predetermined pattern 54, which is the mirror image of pattern 44 to provide a mirror shaped magnetic field.

Similarly, member 36, a capacitor in this example, includes solder bumps 56 and a plurality of magnets 58 in a pattern 60 which is the mirror image of pattern 48.

Magnetic forces arise between the patterns of magnets as a result of the interaction of the magnetic fields between any two magnets. The magnetic fields are related to the material. While all materials have magnetic properties, what are commonly referred to as magnets are typically ferromagnetic in nature and can be classified as either hard or soft magnets. Hard magnetic materials possess a strong permanent magnetization, while soft magnetic materials incur a strong magnetization only upon the application of an external magnetic field. The use of different magnetic materials possessing different magnetic properties and strengths provides flexibility in the design.

By utilizing complimentary magnetic field patterns, a magnetic "lock and key" matching mechanism is provided. The size, shape, material type, and number of the individual magnets can be used to control the total magnetic patterns of the magnets, resulting in complex magnetic force field interactions, permitting a degree of pattern-matching between the components.

If sufficiently asymmetric and diverse patterns are generated, it enables orientational uniqueness, bonding selectivity and inter-part bonding. These capabilities are achieved simultaneously in one massively parallel self-assembly step. In an embodiment, agglomeration is prevented because the individual magnets for any given component type are magnetized in the same direction (e.g., all having north or south polarities for the hard magnets). In additional embodiments, more complicated magnetic field patterns are utilized with agglomeration prevented as the magnetic attraction between parts of the same type are lower than the mixing force used. Thus, parts of the same type will repel each other, increasing the overall speed of the matching process while preventing misalignment of two bodies.

Figure 5:
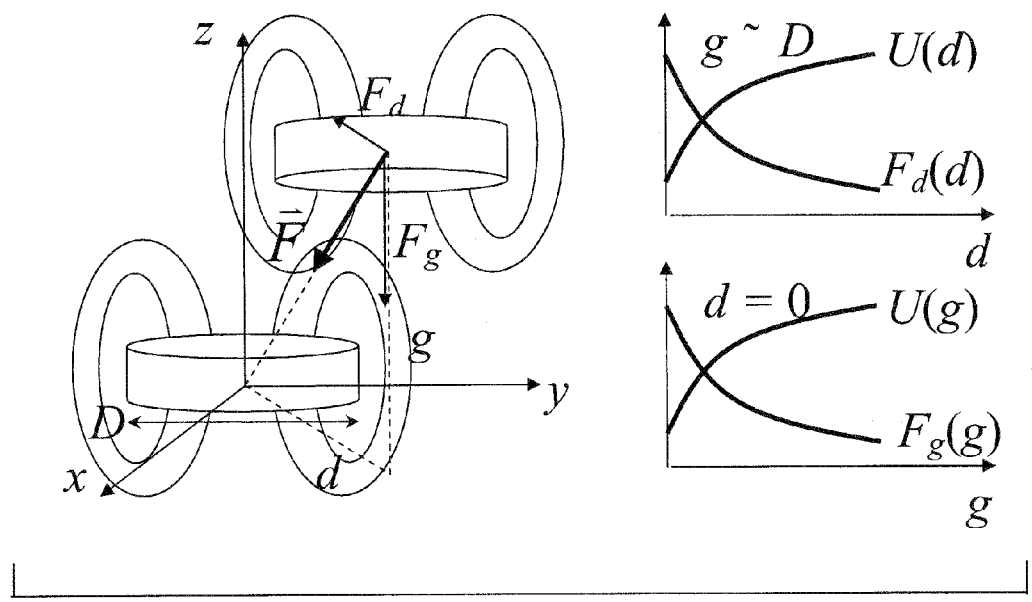
FIG. 5 is a graphical representation of the magnetic forces and potential energy between two uniformly magnetized permanent magnets for demonstrating an aspect of the invention.
Figure 6:
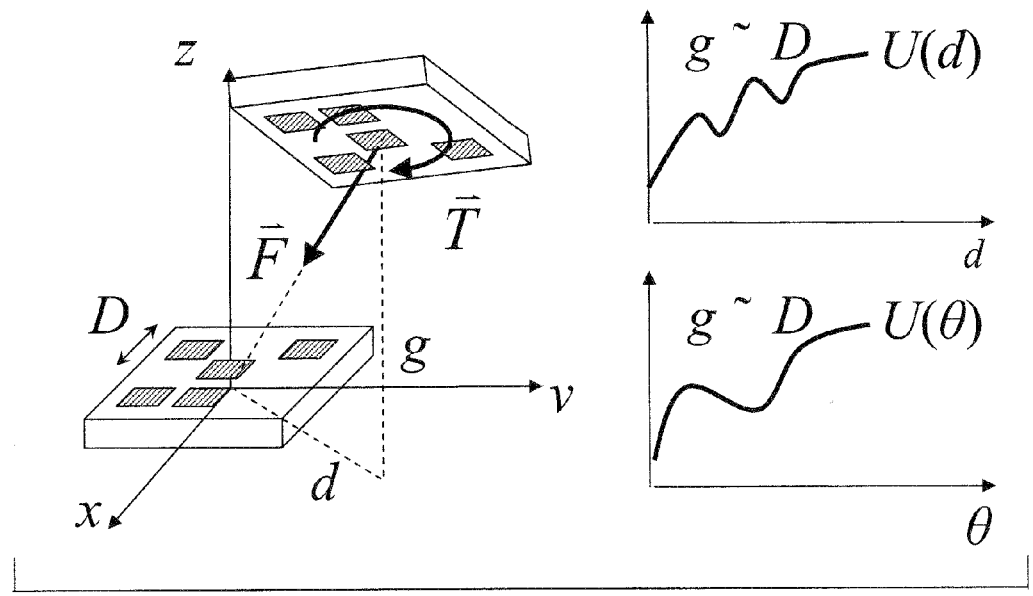
FIG. 6 is a schematic and graphical representation of the magnetic forces at work in accordance with the invention.
Figure 7A:
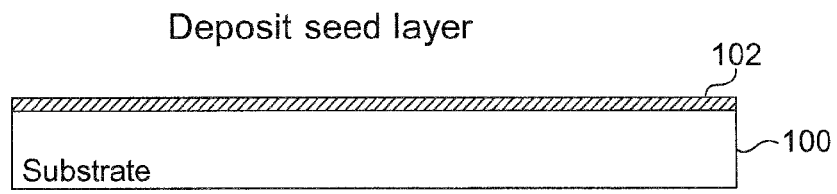
FIGS. 7A-7E show a schematic representation of the fabrication of wafers in accordance with the invention.
Figure 7B:
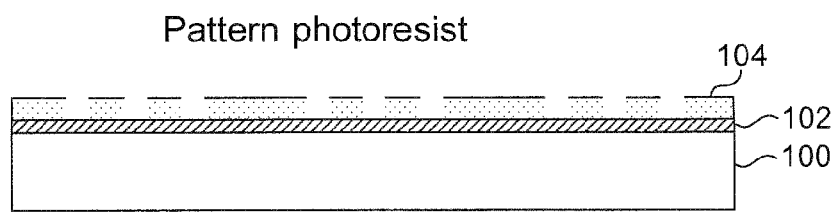
Figure 7C:
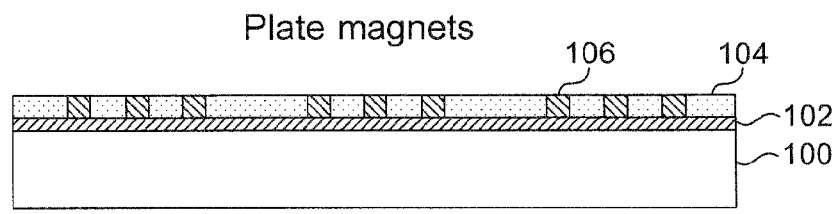
Figure 7D:
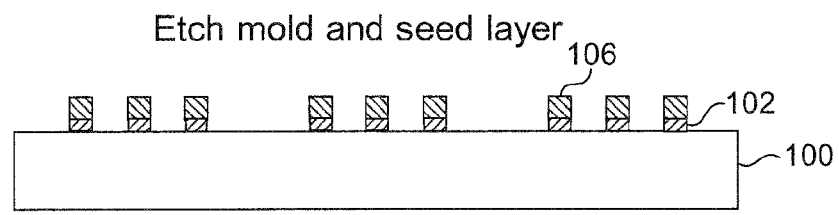
Figure 7E:
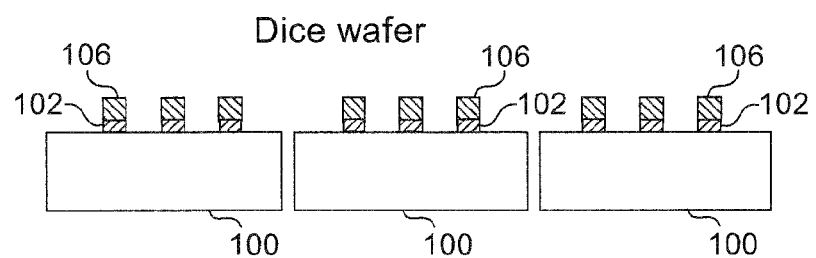

Reference is now made to FIGS. 5 and 6 for illustrating how the inherent properties of the individual magnets in the array will aid the self-sorting process. As shown in FIG. 5, two uniformly magnetized magnets are separated axially by a gap g and a lateral displacement, d. Under quasi-static conditions, the magnetic force, $\vec{F}$, between the two magnets can be computed using several approaches: Maxwell's stress tensor, energetic principles (method of virtual work), or equivalent source models. For all but the simplest geometries, finite-element methods are typical employed and for finite-element modeling, the method of virtual work has been shown to be the most precise.

In this approach, the magnetic force is calculated by the derivative of the magnetic energy, U, with respect to a virtual displacement, ds:

$$\vec{F} = \frac{\partial U}{\partial s} s \quad (1)$$

The energy is related to the magnetic field distribution $\vec{B}$ by, $$U = \frac{1}{2\mu_0} \int_v |\vec{B}|^2 dV, \quad (2)$$

where V is the volume, $\mu_0$ is the magnetic permeability of free space. From Eq. (1), it is clear the force acts in a direction so as to reduce the energy stored in the magnetic field. As shown in FIG. 5, the force acts to close the magnetic gap and can be decomposed into an axial pull-in force, $F_g$, and a radial alignment force, $F_d$, both functions of the gap, g, and displacement, d.

Magnetic pattern-matching is possible by combining the interactions of multiple magnets, as depicted in FIG. 6. Here, a plot of potential energy of the system versus lateral displacement, d, exhibits several local minima, as individual magnets align, but only one global minimum, where all the magnets align. Physically, as the arrays shift with respect to each other, overlap of individual magnets may cause small bonding forces. However, the peak bonding force for the system is not reached until all magnets are acting in parallel. This same effect would apply for rotational misalignment, denoted θ, and therefore could be used to realize orientational uniqueness.

This concept can also be extended to achieve bonding selectivity by considering the potential energy between different magnetic patterns. As dissimilar patterns overlap, individual magnets may cause small bonding forces, the parts will continue to mix until a part with the correct pattern fills the vacancy, thereby minimizing the total free energy. Again, by setting the mixing force higher than any attraction other than that provided by full alignment, the correct orientation will be self-selecting. In an embodiment, if magnets within the pattern are of different polarity, the patterns could cause repulsion between two bodies unless orientation between the patterns was correct so that all magnets attracted all opposed magnets.

Referring back to FIG. 3, during use, a first body such as circuit board 32, is provided with at least one predetermined pattern 44 of a plurality of magnets 42. A desired matching body, such as flip chip 34, is provided with a pattern 54 of a plurality of magnets 50. Magnets 50 are the opposite in polarity of magnets 42, although all of magnets 50 need not be the same polarity. Magnets 50 and/or magnets 42 are hard magnets. However, either one of magnets 50 or 42 may be hard magnets, while the other is a soft magnet. Member 32 and member 34 are mixed with each other. Because of the complementary magnetic patterns, when the magnetic attraction between member 34 and member 32 is sufficient to overcome the mixing forces, member 34, the flip chip, will be affixed to member 32 on the circuit board in the desired orientation so that solder bumps 52 are aligned with solder bumps 40. Because of the need for the magnetic attraction to overcome the mixing force, all non-aligned patterns will be dislodged or repulsed. For this reason, pattern 48 would not sufficiently attract pattern 54 because the overlay of magnets 50 with magnets 46 would not provide sufficient one-to-one correlation to overcome the mixing forces.

Similarly, second member 36 thrown into the same mixing process would, in parallel, become attracted to circuit board 32 because of the complementary magnetic patterns mirror image magnet patterns 48, 60. In this way, capacitor 36 and flip chip 34 are self-selecting for their appropriate position relative to circuit board 32. The same would be true if circuit board 32 were in fact broken into two pieces so that one half of circuit board 32 would be self-selecting with flip chip 34 while the other half would be self-selecting with capacitor 36 to prevent misfit or disorientation.

Figure 4A:
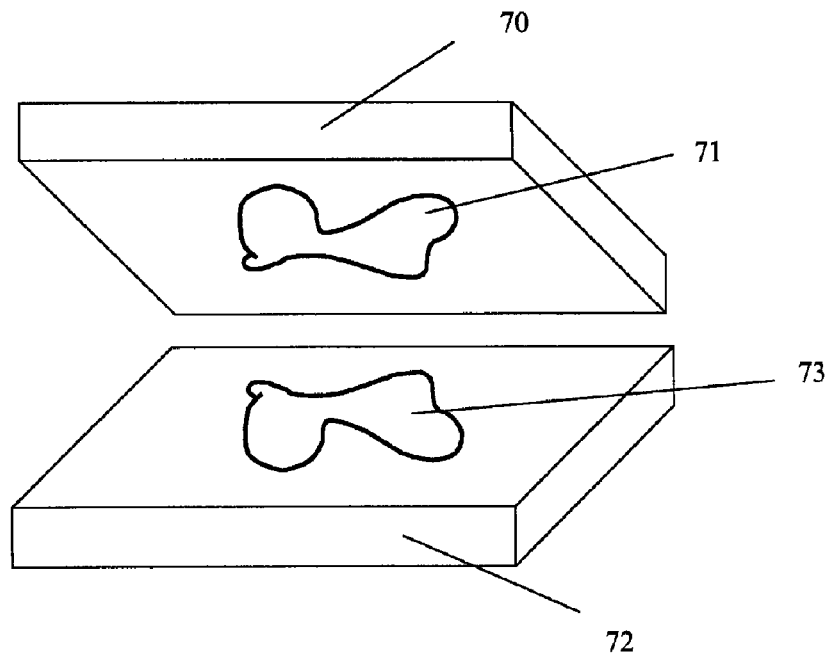
FIG. 4A is an exploded perspective view of a self-assembled circuit constructed in accordance with the invention.
Figure 4B:
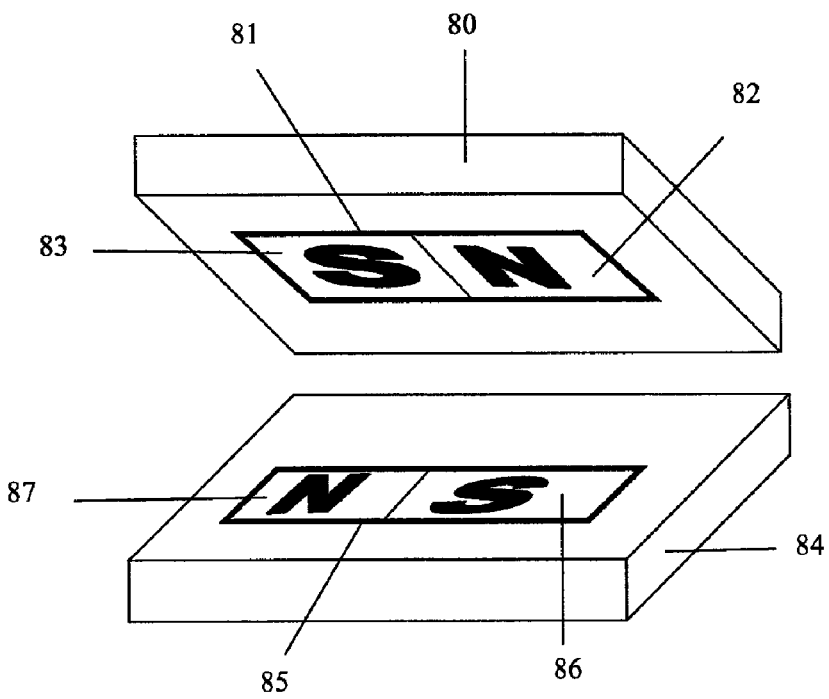
FIG. 4B is an exploded perspective view of a self-assembled circuit constructed in accordance with the invention.

The above examples were described in connection with patterns of a plurality of magnets. However, a patterned magnetic field is needed. Therefore, it is within the scope of the invention to provide a patterned magnetic field from a single magnet having a unique physical shape attracting a second single magnet of mirrored unique physical shape. FIG. 4A illustrates such an embodiment. For example, as shown in FIG. 4A, a first part 70 having a single magnet 71 with a unique shape can attract a second part 72 having a single magnet 73 of mirrored unique physical shape. A third manner to obtain the patterned magnetic field is to provide a single physical magnet with varying magnetic properties (magnetization pattern) within itself in the desired pattern. FIG. 4B illustrates such an embodiment. For example, as shown in FIG. 4B, a first part 80 can have a single physical magnet 81, for example in a stripe shape with a north polarized region 82 and a south polarized region 83 within the stripe shaped single magnet 81. A second part 84 can have a single physical magnet 85 with a south polarized region 86 and a north polarized region 87. In various embodiments, various combinations of permanent magnets, soft magnets, magnet arrays, magnet shapes, magnet magnetization profiles, and magnet patterns can be used to achieve a desired magnetic field pattern.

It is preferable for the magnetic materials to be integrated into the component structures. The magnetic structures are relatively small in volume as compared to the bodies in which they reside and therefore large amounts are not required reducing the relative cost.

For many microscale magnetic devices, relatively voluminous permanent magnets are needed in order to provide strong magnetic fields over large air gaps. Often, conventional bulk magnets are integrated with micromachined structures, but it is difficult, if at all possible, with conventional magnet manufacturing methods to achieve dimensions less than a few hundred microns. In contrast, microfabrication approaches, such as electrodeposition, sputtering, and pulsed-laser deposition, have been developed for depositing various magnetic films, but these methods are usually limited to film thicknesses of a few microns because of relatively slow deposition rates and stresses that can lead to cracking or delamination.

The magnetic processing according to embodiments of the present invention, as will be described below, can be performed in batch operations. For wafer-level processing, micromagnetic components can be integrated at pattern by electrodeposition as seen in FIGS. 7A through 7E.

In the electrodeposition approach, the micro-magnets are patterned generally through photolithography. A substrate 100 is provided at step 7A with a deposited seed layer 102. This conductive seed layer 102 is a thin layer of 0.1 μm. In step 7B, small geometric shapes, having a height in the micrometer to millimeter range, are patterned into a photoresist layer 104, serving as the electroplating mold. In a step 7C, magnetic materials 106 are electroplated into the mold formed by photoresist layer 104. In a step 7D, the mold and seed layer 102 are removed by wet etching as known in the art. In step 7E, the wafer is diced as known in the art. In one embodiment, a thin film of cobalt platinum can be electroplated into the mold.

This process is simple, low cost and CMOS compatible and is efficient for integrating a variety of magnetic materials with sufficient thickness (1 μm to 100 μm+) to provide useful magnetic fields. Many different thick film electroplated permanent magnet materials have been developed for MEMS applications possessing a wide range of magnetic strengths, which would lend themselves to the process.

Figure 8A:
FIGS. 8A-8F show a schematic representation of the fabrication of wafers in accordance with an embodiment of the present invention.
Figure 8B:
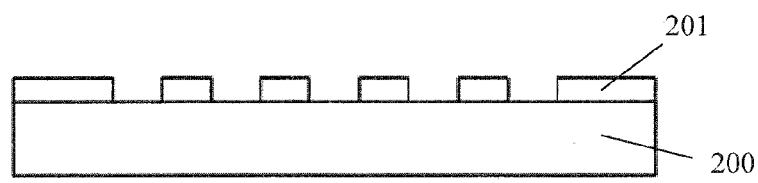
Figure 8C:
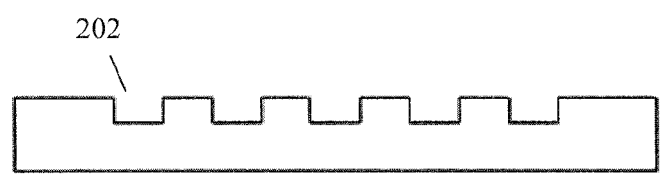
Figure 8D:
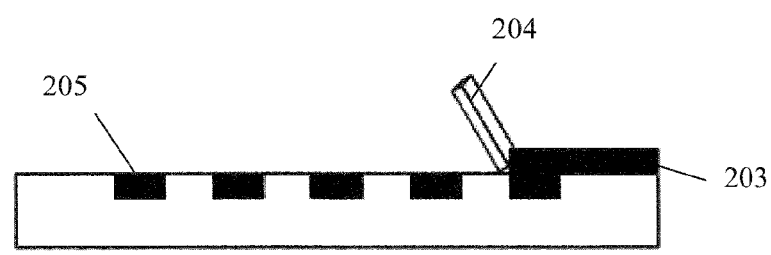

According to another embodiment of the present invention, micromagnetic structures can be embedded in a substrate as seen in FIGS. 8A-8F. In specific embodiments, micromagnetic structures embedded in a substrate can have thicknesses of at least 100 μm, at least 200 μm, or at least 400 μm, in order to provide sufficient magnetic strength for a given application. Referring to FIG. 8A, a silicon substrate 200 can be provided. The substrate 200 can include circuits or structures on certain regions, or can be later provided with circuits or structures after forming the embedded magnets. In specific embodiments, fabrication of embedded micromagnetic structures begins with patterning a photoresist 201 on the substrate 200. Referring to FIG. 8C, a deep reactive ion etch can be performed using the patterned photoresist 201 to pattern embedded trenches 202 into the wafer's surface. In a specific embodiment, the trenches 202 can be etched to a depth of about 10 μm to a depth of about 500 μm. Then, the patterned photoresist 201 can be removed. In one embodiment, the photoresist can be removed by rinsing the wafer 200 with acetone, methanol, and de-ionized water. Referring to FIG. 8D, the trenches 202 are packed with magnetic powder 203. According to embodiments of the present invention, the trenches can be packed with magnetic powder without the use of a polymer or resin carrier. In a specific embodiment, the magnetic powder is samarium cobalt (SmCo). According to an embodiment, SmCo powder can be poured onto the wafer's surface. Then, the powder 203 can be packed into the trenches 202 with compression by wiping a flat edge 204 across the wafer 200 leaving only SmCo powder in the trenches (see reference 205). Residual powder particles can be removed with, for example, a nitrogen gun or a cleanroom wipe.

Figure 8E:
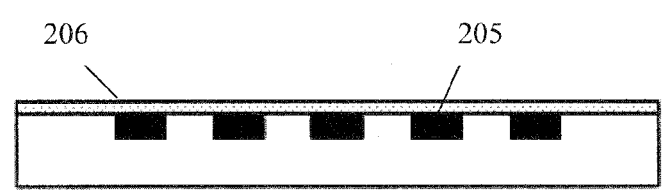
Figure 8F:
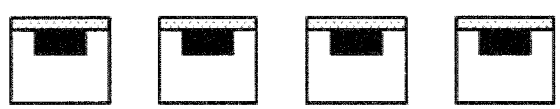

Referring to FIG. 8E, the packed powder 205 can be capped with a polyimide 206. The polyimide coating can be used to inhibit oxidation and to keep the powder within the trenches. In one embodiment, adhesion promoter can be spun over the surface of the wafer at 2000 rpm for 30 seconds and then baked at 95° C. for 3 minutes. Then polyimide can be spun onto the wafer at 2000 rpm for 1 minute and then baked at 150° C., ramping up to 300° C. at a ramp rate of 15° C. per minute. Upon reaching 350° C., the temperature can be held for another 3 minutes before removing the wafer from the hotplate.

After microfabrication, the wafers can be placed in a pulse magnetizer and magnetized in a preferential direction using a pulsed magnetic field of about 3 T.

In another embodiment, wax-bonded micromagnets can be fabricated for use in magnetic self-assembly of millimeter scale components. In a specific embodiment, wax powder particles are introduced as a binder agent for dry packing neodymium iron boron (NdFeB) powder in preetched trenches. According to one embodiment, a small amount of wax powder, such as 2.00-6.75 wt %, can effectively lock the magnetic powder within the trench to form micromagnets. In an example, the rare earth NbFeB magnetic powder includes particles having ball shapes, distributed size, and an average diameter of about 50 μm. The binder wax may be a wax having a melting temperature of 80° C. According to one embodiment, the wax can be crushed to a coarse powder, followed by 24 hours of ball milling to obtain fine particles. The wax powder may have an average diameter of about 5 μm using such a process.

According to an example showing effects of different wax powder loadings within the powder packed into the trenches, the magnetic powder was homogeneously mixed with various wax powder loading fractions from 2 to 15 wt %. The mixture was dry packed at room temperature into preetched rectangular cavities (500×500 μm$^2$ laterally; 320 μm deep) in a silicon wafer with compression by wiping a flat edge across the wafer, leaving only powder in the trenches. After packing, the whole silicon wafer was heated in an oven at 90° C. for 2 min and then cooled down in air, allowing the wax to melt and bond the magnetic particles. Finally, the wafer surface was cleaned by de-ionized water and blown dry with nitrogen. For characterization, the wafer was placed in a pulse magnetizer and magnetized in the in-plane direction using a pulsed magnetic field of ~3 T.

Figure 13:
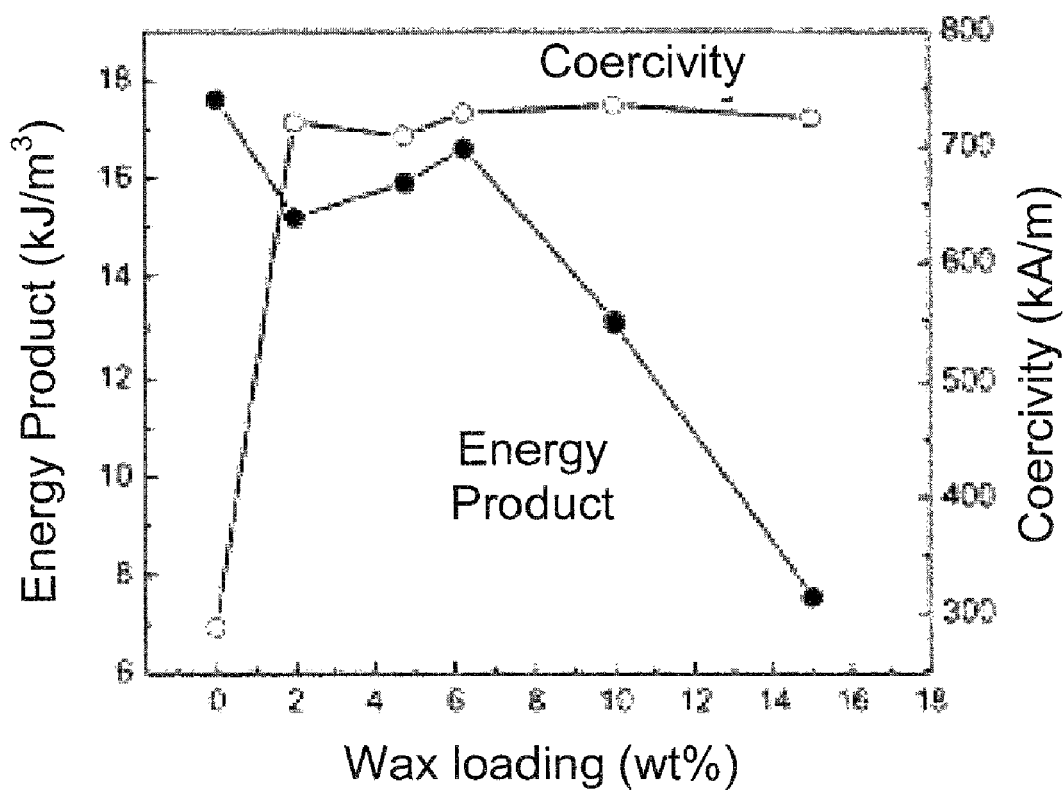
FIG. 13 shows a plot of energy products and coercivities of wax-bonded micromagnets as a function of wax weight percentage in accordance with an embodiment of the present invention.

FIG. 13 shows the energy product and coercivity as a function of the wax weight percentage. The data show an optimum wax loading condition at 6.25%. Below this value, the motion of unbonded particles appears to cause a decrease in the energy product, while above this value, the dilution of the magnetic moment by the binder wax also appears to decrease the energy product. These two mechanisms compete with each other to yield an optimum point. In addition, the results indicate that the coercivity is substantially improved when a small amount of wax is introduced, and fairly constant for all weight fractions tested. In the described experiment, the micromagnet coercivity improves over the raw dry-packed powder from 287 kA/m to 737 kA/m. This approach can be applied to other magnetic powders in accordance with embodiments of the present invention. The smallest magnet dimension may be limited by the powder size. Although the wax used in the above described study may not integrate easily into wafer-scale fabrication processes because of the wax's melting point of 80° C., other waxes or similar bonding agents with higher melting points may be used in its place.

Other methods exist in the art for patterning small magnetic patterns onto micro-fabricated parts, such as sputtering, pulsed-laser deposition, and evaporation. For non-micro-fabricated parts, screen printing particle could be used. Also, new liquid metal jet printing methods, similar to inkjet printing, may be used to deposit small molten droplets of metallic alloys in pattern arrays. Lastly, magnetic materials may be diffused in a pattern into a substrate or body. As a result of providing a predetermined magnetic pattern and a complementary magnetic pattern thereof on two respective bodies, it is possible to self-assemble small free floating bodies on a large parallel basis. By providing specific magnet patterns, the bodies will be self-selecting and self-orienting to each other so that only the correct bodies in the correct orientations will bond in a mixing process, whether wet or dry.

In a specific embodiment, the first magnetic field on the first body can be n-fold symmetric and the second magnetic field on the second body can be n-fold symmetric such that there are n orientations that the second body can be fully aligned and bonded with the first body. In other embodiments, the complementary first and second magnetic fields are asymmetric such that only one orientation of the first and second bodies results in full alignment and bonding.

In a specific embodiment, a structure can have additional bodies that can align and bond to the second body, or any other body of the structure, due to magnetic fields on the additional bodies and the bodies to which the additional bodies align and bond. As an example, a robot structure can have a torso that aligns and bonds with a right arm, a left arm, a right leg, a left leg, and a head. Each of the parts, or bodies, can selectively bond to the torso such that each part bonds only to the appropriate location and not to other locations. In a further embodiment, a right hand, a left hand, a right foot, and a left foot, can align and bond with the right arm, the left arm, the right leg, and the left leg, respectively. The alignment and the bonding can be done in stages or simultaneously. In this way, a plurality of torso and a corresponding plurality of associated parts could be mixed such that the robots are self-assembled. In an analogous way, other structures, such as MEMS structures, could be assembled. Such structures could include a variety of parts to be assembled, such as gears, blocks, levers, and other structures that can be held together via magnets incorporated with the parts.

In an embodiment, the first body and second body that will be in contact after alignment and bonding can incorporate other attachment and/or connectivity means, such as glues for mechanical adhesion and solder bumps for electrical connectivity or bonding. In an embodiment, solder bumps can be used such that heating after alignment and bonding can cause a portion of the first body to be soldered to a portion of the second body. In another embodiment, glue can be used such that heating after alignment and bonding can cause a portion of the first body to be glued to a portion of the second body.

In a specific embodiment, shielding material can be incorporated with the first and/or second body to shield the magnetic fields of the first and/or second body from portions of the aligned and bonded structure or other objects proximate to the structure. Such shielding materials are well known in the art. As an example, soft magnetic materials can be used as shielding. A layer of soft magnetic material can be placed on one or more bodies and then the magnets for the body grown on the soft magnetic material layer such that the portion of the body below the layer is shielded from the magnetic fields of the magnets grown on the layer.

In a specific embodiment, demagnetizable magnets and/or magnetic materials can be used such that after alignment and bonding, and optional implementation of additional attachment means, the demagnetizable magnets and/or magnetic material can be demagnetized. In an example, magnets and/or magnetic material that can be demagnetized by heating can be used. Such materials are well known in the art. In a specific embodiment, magnets and/or magnetic materials that can be demagnetized by heating to demagnetization temperatures under 500° C. can be used.

Preferably, the magnetic attraction force between two bodies are at least as great as the weight force of the body free to move, and at least as great as the weight force of the lightest body if both bodies are free to move. Preferably, the magnetic attraction force is two to ten as great as the weight force of the body free to move, and at least two to ten as great as the weight force of the lightest body if both bodies are free to move.

Figure 10:
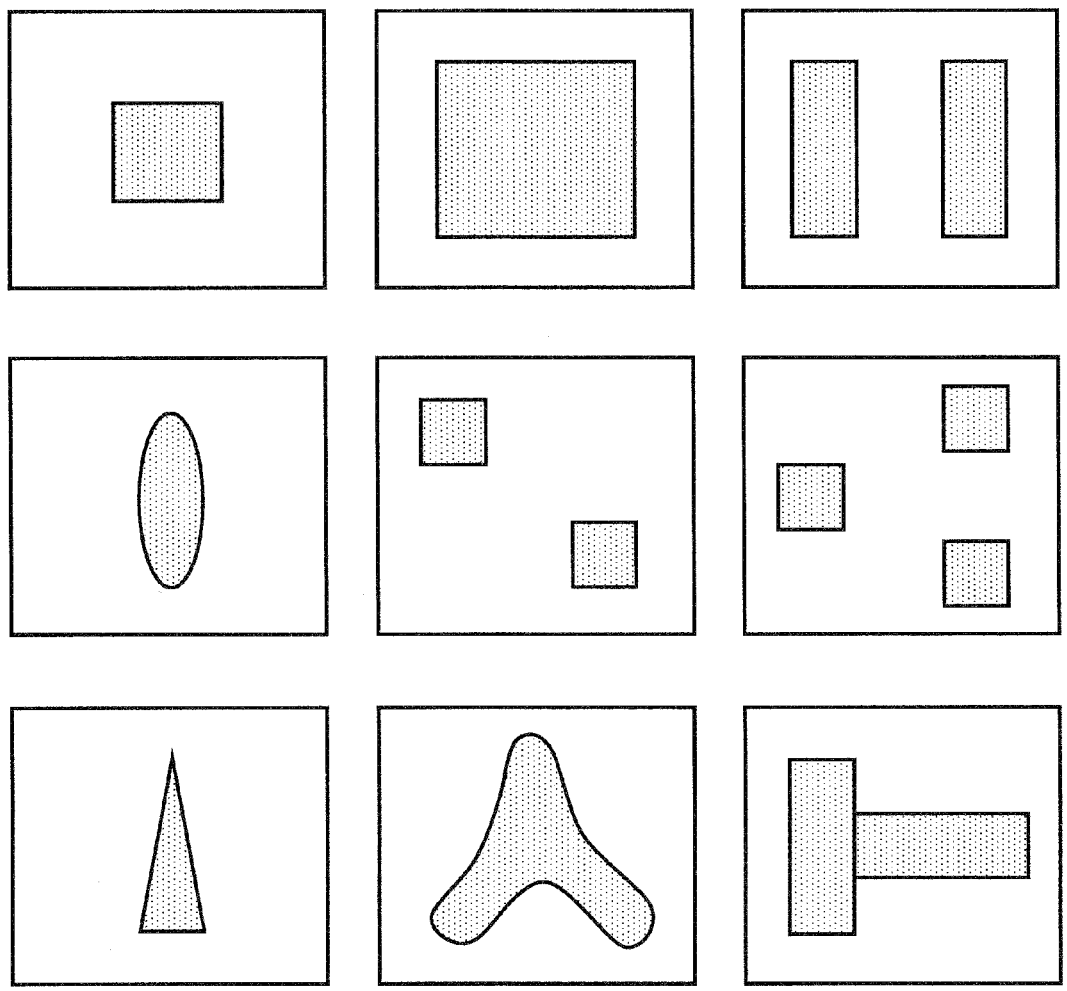
FIG. 10 shows components with embedded magnets with 4-fold, 2-fold, or no symmetry, respectively, in accordance with the invention.
Figure 11:
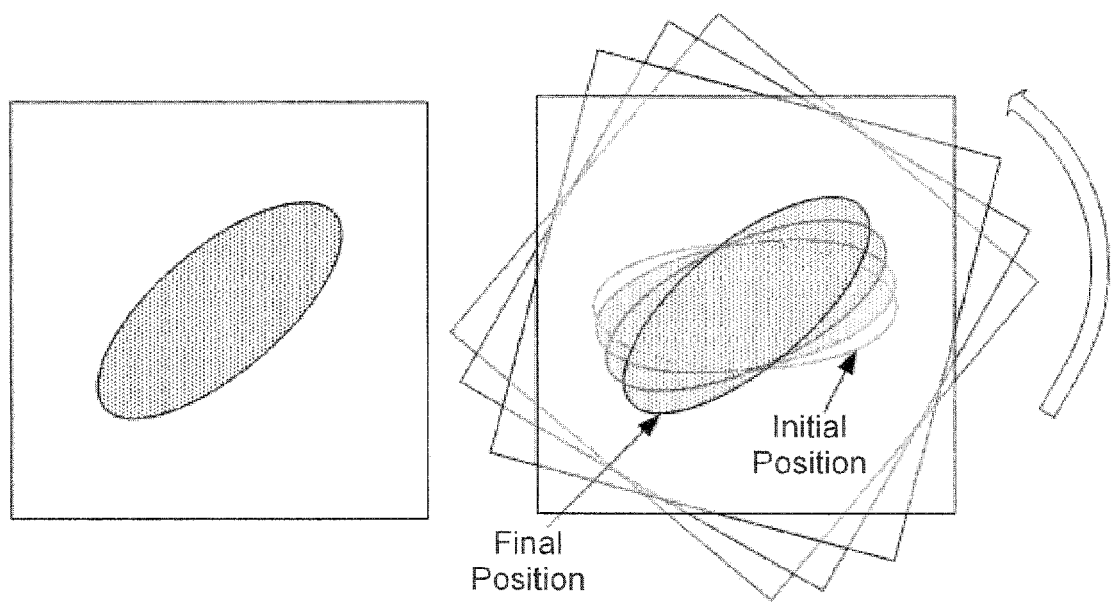
FIG. 11 shows a schematic representation of rotation and alignment for self-assembly according to an embodiment of the present invention.
Figure 12:
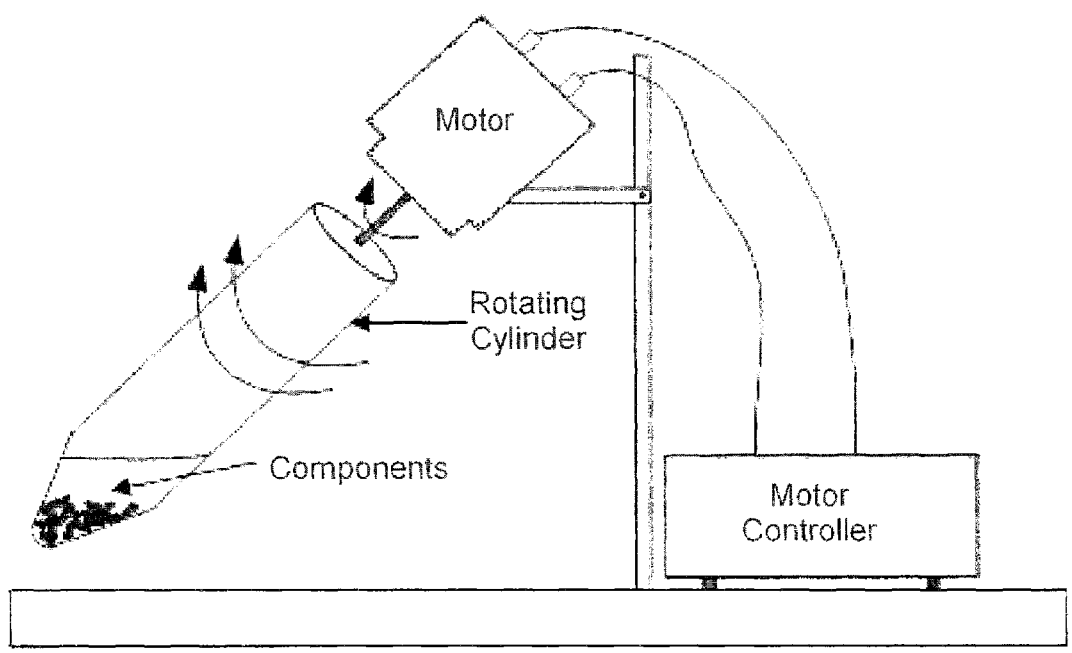
FIG. 12 shows an experimental setup for part-to-part magnetic self assembly in accordance with an embodiment of the present invention.

Embodiments of the present invention can provide magnetic self assembly of mm-scale components. FIGS. 10-12 show specific examples in accordance with certain embodiments of the present invention. According to one embodiment example, a 500 μm thick silicon wafer is patterned with squares using a positive tone photoresist. Subsequently, 60 μm deep trenches are etched using deep reactive ion etching. SmCo powder, having an average particle size of 5 μm to 10 μm is packed into these trenches. To inhibit spilling of the powder, a ~5 μm layer of polyimide is then spun and cured on top. The individual parts for this example are created by dicing the wafer into chips of size 1 mm$^2$. The fabricated square shaped magnets are either 500 μm×500 μm×60 μm or 850 μm×850 μm×60 μm, covering approximately 25% and 75%, respectively, of the 1 mm$^2$ part surface area. Substrates with a 4×4 array of receptor sites are created using the same fabrication process.

Figure 9:
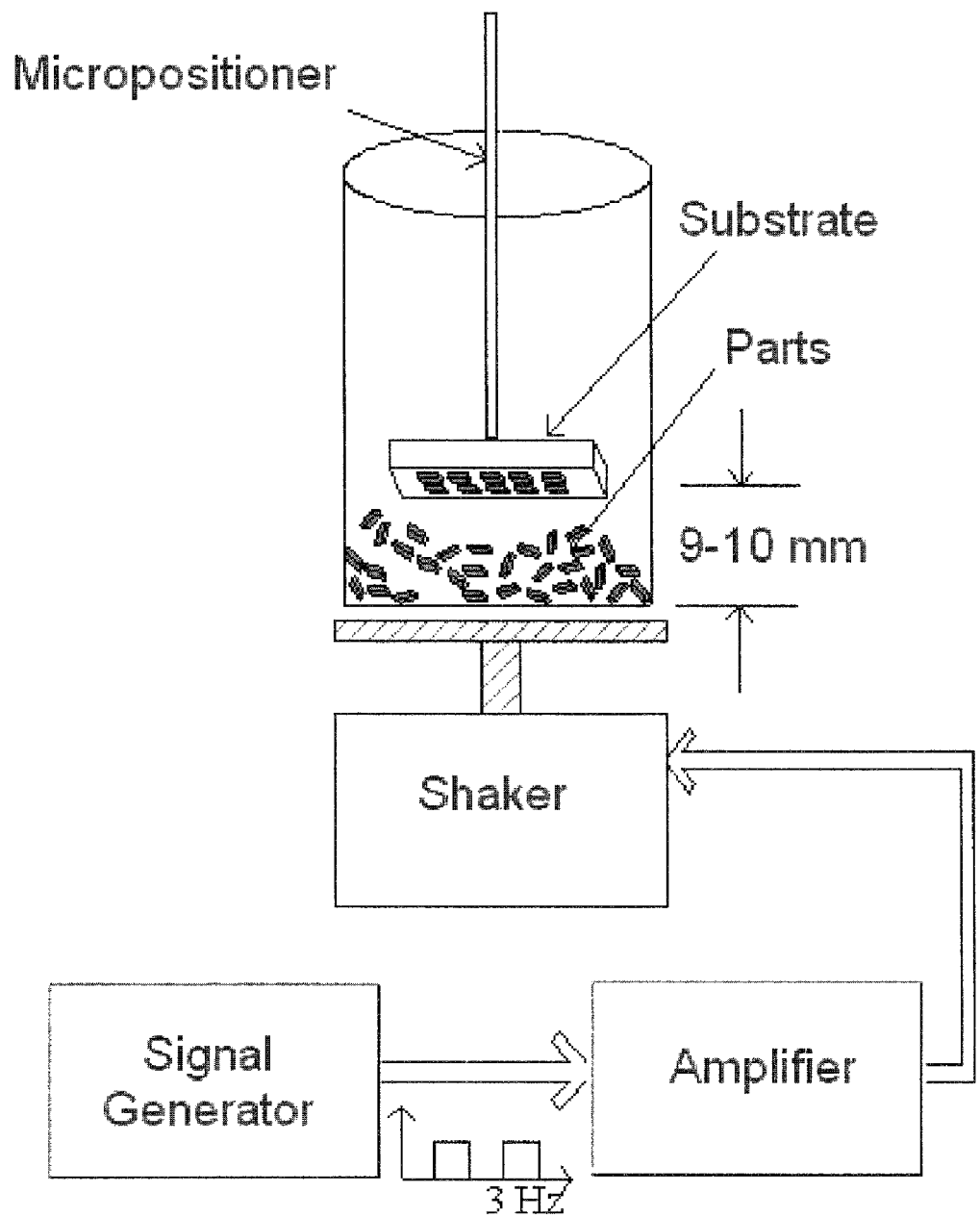
FIG. 9 shows a schematic representation of an experimental setup for magnetic self assembly in accordance with an embodiment of the present invention.

The experimental setup for demonstrating the part to substrate assembly is shown in FIG. 9. Referring to FIG. 9, the parts are placed in a small glass container, which in turn is placed on an electromechanical shaker. The substrate is attached, with its face down, to a 3-D micro-positioner and then lowered into the glass container and positioned approximately 9 mm above the base of the glass container. The input to the shaker is a square wave with a frequency of 3 Hz and amplitude of 2 V p-p, from the signal generator. The shaker displacement at 3 Hz and 2 V is 1.8 mm p-p causing the parts to bounce up and down and self assemble onto the substrate. For this experiment, there are approximately 5 times as many parts as the number of receptor sites. Self-assembly using parts with the 850 μm×850 μm magnets (75% surface area) can occur within about 10 s. The experiment was performed repeatedly and resulted in all 16 sites being filled in approximately 7 seconds. Using 7 seconds as a benchmark assembly time, the average yield (number of parts assembled divided by the total number of receptor sites) is approximately 98.7%.

For the smaller 500 μm×500 μm magnets, the average assembly time is 10 s with a yield of 97.5%. The longer assembly time and lower yield is attributed to the smaller magnets resulting in lower magnetic forces. In other embodiments, the part to substrate assembly can be carried out at a micron scale using, for example, thin-film cobalt-platinum (CoPt) electroplated magnets.

FIG. 10 shows different magnetic patterns such as squares, stripes, and ovals with 2-fold and 4-fold rotational symmetry fabricated according to an embodiment of the present invention. The magnets can be batch-fabricated at the wafer level using a packed trench fabrication process as described above. For example, 100 mm diameter, 500 μm thick Si wafers can be etched to form small cavities and then packed with SmCo magnetic powder. A thin layer of polyimide can be spun on the wafer to lock the powder in place. After magnetization of the magnets using an external field, the wafer can be diced into individual components. The magnets shown in FIG. 10 can be packed powders; however, embodiments are not limited thereto.

Referring to FIG. 11, self-assembly occurs when the embedded magnets with opposite polarity bond to one another, resulting in an energy minima. Intermagnetic forces and torques compel the components to rotate and align such as shown in FIG. 11. The square magnetic patterns shown in FIG. 10 exhibit 4-fold rotational symmetry resulting in four possible bonding orientations, while the square, stripe and oval patterns in FIG. 10 exhibit 2-fold symmetry permitting assembly in only two orientations. Unique orientations are also shown in FIG. 10. It should be noted that symmetry increases the probability for bonding and thus appears to increase assembly speed and yield.

A self-assembly according to an embodiment example was accomplished using the apparatus shown in FIG. 12. A rotating conical tube with ~1 mL of methanol enables the components to mix and tumble over each other. The tube is inclined at an angle of 35-45 degrees and rotated at ~60 rpm. The methanol inhibits the components from sticking to the tube surface and mitigates air bubble formation. In one embodiment, 8 components were magnetized with one magnetic polarity and an excess (~32) of complementary components were magnetized with opposite polarity. Each set of like parts will not bond to themselves since they have the same polarity, thus avoiding agglomeration.

Thus, while there have been shown, described and pointed out novel features of the present invention as applied to preferred embodiments thereof, it will be understood that various omissions and substitutions and changes in the form and detail are contemplated so that the disclosed invention may be made by those skilled in the art without departing from the spirit and scope of the invention. It is the intention therefore to be limited only as indicated by the scope of the claims appended hereto. It is also to be understood that the following claims are intended to cover all of the generic and specific features of the invention herein described and all statements of the scope of the invention, which as a matter of language might be said to fall therebetween.

What is claimed is:

1. A structure adapted for magnetically-directed, self-assembly, comprising:
   a first body, the first body exhibiting a first magnetic field having a first predetermined pattern; and
   a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, wherein the mixing force is higher than any magnetic attraction force between the first body and the second body other than that provided by full alignment of the first body and the second body.

2. The structure of claim 1, wherein the first magnetic field is formed by a first at least one permanent magnet disposed on the first body.

3. The structure of claim 2, wherein the first at least one permanent magnet is a first plurality of permanent magnets.

4. The structure of claim 3, wherein at least one permanent magnet of the first plurality of permanent magnets has a different magnetization direction than at least one other permanent magnet of the first plurality of permanent magnets.

5. The structure of claim 3, wherein at least one permanent magnet of the first plurality of permanent magnets has an opposite polarity to at least one other permanent magnet of the first plurality of permanent magnets.

6. The structure of claim 2, wherein the first at least one permanent magnet is a first single permanent magnet with a first complex physical shape.

7. The structure of claim 2, wherein the second magnetic field is formed by a second at least one permanent magnet disposed on the second body.

8. The structure of claim 7, wherein the second at least one permanent magnet forms a second pattern of magnets that is a mirror image of a first pattern of magnets formed by the first at least one permanent magnet.

9. The structure of claim 2, wherein the second magnetic field is formed by at least one soft magnet disposed on the second body, wherein the second magnetic field is exhibited when the at least one soft magnet is magnetized by the first magnetic field.

10. The structure of claim 9, wherein the at least one soft magnet forms a second pattern of magnets that is a mirror image of a first pattern of magnets formed by the first at least one permanent magnet.

11. The structure of claim 2, wherein at least one of the first at least one permanent magnet has varying magnet properties.

12. The structure of claim 6, wherein the second magnetic field is formed by a second single permanent magnet with a second complex physical shape disposed on the second body.

13. The structure of claim 12, wherein the second complex physical shape is a mirror image of the first complex physical shape.

14. The structure of claim 6, wherein the second magnetic field is formed by a single soft magnet with a second complex physical shape disposed on the second body, wherein the second magnetic field is exhibited when the single soft magnet is magnetized by the first magnetic field.

15. The structure of claim 14, wherein the second complex physical shape is a mirror image of the first complex physical shape.

16. The structure of claim 2, wherein the at least one permanent magnet is demagnetizable.

17. The structure of claim 1, wherein the first magnetic field is n-fold symmetric.

18. The structure of claim 1, wherein the first magnetic field is asymmetric.

19. The structure of claim 1, wherein the mixing force is higher than magnetic attraction forces for local minima of potential energy versus lateral and/or rotational misalignment of the first body and the second body from full alignment.

20. The structure of claim 1, wherein the second predetermined pattern is complementary to the first predetermined pattern.

21. The structure according to claim 1, further comprising:
a means for attaching the first body to the second body after the first body and the second body are bonded together.

22. The structure of claim 1, further comprising:
shielding, wherein the shielding shields at least a portion of the first magnetic field or the second magnetic field from at least a portion of the first body or the second body when the first body and the second body are bonded together.

23. The structure of claim 1, where the magnetic attraction force between the first body and the second body is at least two times a weight force of the lighter of the first body and the second body.

24. The structure of claim 1, wherein the first magnetic field is formed by magnetic material having a thickness in a micrometer to millimeter range; and wherein the second magnetic field is formed by magnetic material having a thickness in the micrometer to millimeter range.

25. The structure of claim 1, wherein the first magnetic field is formed by magnetic material having a thickness of between about 10 µm and about 500 µm; and wherein the second magnetic field is formed by magnetic material having a thickness of between about 10 µm and about 500 µm.

26. The structure of claim 1, wherein the first magnetic field is formed by magnetic material comprising samarium cobalt (SmCo) powder.

27. The structure of claim 1, wherein the first magnetic field is formed by magnetic material comprising neodymium iron boron (NdFeB) powder.

28. The structure according to claim 1, wherein the first body comprises a micromagnetic structure embedded in a substrate, wherein the micromagnetic structure has a thickness of at least 100 µm.

29. The structure according to claim 28, wherein the micromagnetic structure has a thickness of at least 200 µm.

30. The structure according to claim 28, wherein the micromagnetic structure has a thickness of at least 400 µm.

31. The structure according to claim 1, wherein the first magnetic field extends from a first surface of the first body, wherein the second magnetic field extends from a second surface of the second body, wherein when the first body and second body are fully aligned to each other and bonded together, the first surface of the of the first body is fully aligned and bonded to the second surface of the second body.

32. A structure adapted for magnetically-directed, self-assembly, comprising:
a first body, the first body exhibiting a first magnetic field having a first predetermined pattern;
a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force; and
a third body, the third body exhibiting a third magnetic field having a third predetermined pattern, wherein the first body further exhibits a fourth magnetic field having a fourth predetermined pattern, wherein the first body and the third body are fully aligned to each other and bonded together by a magnetic attraction force between the first body and the third body due to the fourth and third magnetic fields when the magnetic attraction force between the first body and the third body is sufficient to overcome the mixing force.

33. The structure of claim 32, wherein the mixing force is higher than any magnetic attraction force between the first body and the third body other than that provided by full alignment of the first body and the third body.

34. The structure of claim 33, wherein the mixing force is higher than local minima of potential energy versus lateral and/or rotational misalignment of the first body and the third body.

35. The structure of claim 32,
wherein the first body exhibits the first magnetic field at a first portion of the first body and the first body exhibits the fourth magnetic field having a fourth predetermined pattern at a second portion of the first body,
wherein the first body is capable of selectively bonding with the second body at the first portion of the first body and selectively bonding with the third body at the second portion of the first body, such that the mixing force is higher than any magnetic attraction force between the first portion of the first body and the third body, and the mixing force is higher than any magnetic attraction force between the second portion of the first body and the second body, wherein the mixing force is higher than any magnetic attraction force between the second body and the third body.

36. A structure adapted for magnetically-directed, self-assembly, comprising:
a first body, the first body exhibiting a first magnetic field having a first predetermined pattern;
a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force; and
at least one additional body, the at least one additional body exhibiting a corresponding at least one additional magnetic field having a corresponding at least one additional predetermined pattern, wherein the first body further exhibits a corresponding at least one additional magnetic field having a corresponding at least one additional predetermined pattern, wherein the first body and each of the at least one additional body are fully aligned to each other and bonded together by a magnetic attraction force between the first body and the at least one additional body due to the corresponding at least one magnetic field of the first body and the corresponding at least one additional magnetic field of the at least one additional body when the magnetic attraction force between the first body and the at least one additional body due to the corresponding at least one magnetic field of the first body and the corresponding at least one additional magnetic field of the at least one additional body is sufficient to overcome the mixing force.

37. A structure adapted for magnetically-directed, self-assembly, comprising:
a first body, the first body exhibiting a first magnetic field having a first predetermined pattern;
a second body, the second body exhibiting a second magnetic field having a second predetermined pattern, wherein the first bow and the second body are fully aligned to each other and bonded together by a magnetic attraction force between the first body and the second body due to the first and second magnetic fields when the magnetic attraction force between the first body and the second body is sufficient to overcome a mixing force, wherein the first body comprises first circuitry thereon and the second body comprises second circuitry thereon, the second circuitry being operatively oriented to the first circuitry when the first body and second body are fully aligned to each other and bonded together.

38. The structure of claim 37, wherein the first circuitry is electronically connected to the second circuitry after the first body and the second body are bonded together.

39. The structure of claim 38, wherein the first circuitry and the second circuitry are electrically connected via solder bumps.

40. A structure adapted for magnetically-directed, self-assembly, comprising:
   a first body, the first body exhibiting a first magnetic field having a first predetermined pattern;
   a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, wherein the mixing force is higher than any magnetic attraction force between the second body and another second body.

41. A method for magnetically-directed, self-assembling parts, comprising:
   providing a first body, the first body exhibiting a first magnetic field having a first predetermined pattern; and
   providing a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, and
   mixing the first body with the second body with the mixing force, wherein the first body and the second body are fully aligned to each other and bonded together by a magnetic attraction force between the first body and the second body when the magnetic attraction force between the first body and the second body is sufficient to overcome the mixing force, wherein the mixing force is higher than any magnetic attraction force between the first body and the second body other than that provided by full alignment of the first body and the second body.

42. The method of claim 41, wherein the first magnetic field is formed by a first at least one permanent magnet disposed on the first body.

43. The method of claim 42, wherein the first at least one permanent magnet is a first plurality of permanent magnets.

44. The method of claim 43, wherein at least one permanent magnet of the first plurality of permanent magnets has a different magnetization direction than at least one other permanent magnet of the first plurality of permanent magnets.

45. The method of claim 43, wherein at least one permanent magnet of the first plurality of permanent magnets has an opposite polarity to at least one other permanent magnet of the first plurality of permanent magnets.

46. The method of claim 42, wherein the first at least one permanent magnet is a first single permanent magnet with a first complex physical shape.

47. The method of claim 42, wherein the second magnetic field is formed by a second at least one permanent magnet disposed on the second body.

48. The method of claim 47, wherein the second at least one permanent magnet forms a second pattern of magnets that is a mirror image of a first pattern of magnets formed by the first at least one permanent magnet.

49. The method of claim 42, wherein the second magnetic field is formed by at least one soft magnet disposed on the second body, wherein the second magnetic field is exhibited when the at least one soft magnet is magnetized by the first magnetic field.

50. The method of claim 49, wherein the at least one soft magnet forms a second pattern of magnets that is a mirror image of a first pattern of magnets formed by the first at least one permanent magnet.

51. The method of claim 42, wherein at least one of the first at least one permanent magnet has varying magnet properties.

52. The method of claim 46, wherein the second magnetic field is formed by a second single permanent magnet with a second complex physical shape disposed on the second body.

53. The method of claim 52, wherein the second complex physical shape is a mirror image of the first complex physical shape.

54. The method of claim 46, wherein the second magnetic field is formed by a single soft magnet with a second complex physical shape disposed on the second body, wherein the second magnetic field is exhibited when the single soft magnet is magnetized by the first magnetic field.

55. The method of claim 54, wherein the second complex physical shape is a mirror-image of the first complex physical shape.

56. The method of claim 42, wherein the at least one permanent magnet is demagnetizable.

57. The method of claim 41, wherein the first magnetic field is n-fold symmetric.

58. The method of claim 41, wherein the first magnetic field is asymmetric.

59. The method of claim 41, wherein the mixing force is higher than magnetic attraction forces for local minima of potential energy versus lateral and/or rotational misalignment of the first body and the second body from full alignment.

60. The method of claim 41, wherein the second predetermined pattern is complementary to the first predetermined pattern.

61. The method according to claim 41, further comprising:
   attaching the first body to the second body after the first body and the second body are bonded together.

62. The method of claim 41, further comprising:
   providing shielding, wherein the shielding shields at least a portion of the first magnetic field or the second magnetic field from at least a portion of the first body or the second body when the first body and the second body are bonded together.

63. The method of claim 41, where the magnetic attraction force between the first body and the second body is at least two times a weight force of the lighter of the first body and the second body.

64. The method of claim 41, wherein the first magnetic field is formed by magnetic material having a thickness in a micrometer to millimeter range; and wherein the second magnetic field is formed by magnetic material having a thickness in the micrometer to millimeter range.

65. The method of claim 41, wherein the first magnetic field is formed by magnetic material having a thickness of between about 10 μm and about 500 μm; and wherein the second magnetic field is formed by magnetic material having a thickness of between about 10 μm and about 500 μm.

66. The method of claim 41, wherein the first magnetic field is formed by magnetic material comprising samarium cobalt (SmCo) powder.

67. The method of claim 41, wherein the first magnetic field is formed by magnetic material comprising neodymium iron boron (NdFeB) powder.

68. The method according to claim 41, wherein the first body comprises a micromagnetic structure embedded in a substrate, wherein the micromagnetic structure has a thickness of at least 100 μm.

69. The method according to claim 68, wherein the micromagnetic structure has a thickness of at least 200 μm.

70. The method according to claim 68, wherein the micromagnetic structure has a thickness of at least 400 μm.

71. The method according to claim 41, wherein the first magnetic field extends from a first surface of the first body, wherein the second magnetic field extends from a second surface of the second body, wherein when the first body and second body are fully aligned to each other and bonded together, the first surface of the of the first body is fully aligned and bonded to the second surface of the second body.

72. A method for magnetically-directed, self-assembling parts, comprising:
providing a first body, the first body exhibiting a first magnetic field having a first predetermined pattern;
providing a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, and
mixing the first body with the second body with the mixing force, wherein the first body and the second body are fully aligned to each other and bonded together by a magnetic attraction force between the first body and the second body when the magnetic attraction force between the first body and the second body is sufficient to overcome the mixing force; and
providing a third body, the third body exhibiting a third magnetic field having a third predetermined pattern, wherein the first body further exhibits a fourth magnetic field having a fourth predetermined pattern, and
mixing the third body with the first body with the mixing force, wherein the first body and the third body are fully aligned to each other and bonded together by a magnetic attraction force between the first body and the third body due to the fourth and third magnetic fields when the magnetic attraction force between the first body and the third body is sufficient to overcome the mixing force.

73. The method of claim 72, wherein the mixing force is higher than any magnetic attraction force between the first body and the third body other than that provided by full alignment of the first body and the third body.

74. The method of claim 73, wherein the mixing force is higher than local minima of potential energy versus lateral and/or rotational misalignment of the first body and the third body.

75. The method of claim 72,
wherein the first body exhibits the first magnetic field at a first portion of the first body and the first body exhibits the fourth magnetic field having a fourth predetermined pattern at a second portion of the first body,
wherein the first body is capable of selectively bonding with the second body at the first portion of the first body and selectively bonding with the third body at the second portion of the first body, such that the mixing force is higher than any magnetic attraction force between the first portion of the first body and the third body, and the mixing force is higher than any magnetic attraction force between the second portion of the first body and the second body, wherein the mixing force is higher than any magnetic attraction force between the second body and the third body.

76. A method for magnetically-directed, self-assembling parts, comprising:
providing a first body, the first body exhibiting a first magnetic field having a first predetermined pattern; and
providing a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, and
mixing the first body with the second body with the mixing force, wherein the first body and the second body are fully aligned to each other and bonded together by a magnetic attraction force between the first body and the second body when the magnetic attraction force between the first body and the second body is sufficient to overcome the mixing force; and
providing at least one additional body, the at least one additional body exhibiting a corresponding at least one additional magnetic field having a corresponding at least one additional predetermined pattern, wherein the first body further exhibits a corresponding at least one additional magnetic field having a corresponding at least one predetermined pattern, and
mixing the at least one additional body and the first body with the mixing force, wherein the first body and each of the at least one additional body are fully aligned to each other and bonded together by a magnetic attraction force between the first body and the at least one additional body due to the corresponding at least one magnetic field of the first body and the corresponding at least one additional magnetic field of the at least one additional body when the magnetic attraction force between the first body and the at least one additional body due to the corresponding at least one magnetic field of the first body and the corresponding at least one additional magnetic field of the at least one additional body is sufficient to overcome the mixing force.

77. A method for magnetically-directed, self-assembling parts, comprising:
providing a first body, the first body exhibiting a first magnetic field having a first predetermined pattern; and
providing a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, and mixing the first body with the second body with the mixing force, wherein the first body and the second body are fully aligned to each other and bonded together by a magnetic attraction force between the first body and the second body when the magnetic attraction force between the first body and the second body is sufficient to overcome the mixing force, wherein the first body comprises first circuitry thereon and the second body comprises second circuitry thereon, the second circuitry being operatively oriented to the first circuitry when the first body and second body are fully aligned to each other and bonded together.

78. The method of claim 77, wherein the first circuitry is electrically connected to the second circuitry after the first body and the second body are bonded together.

79. The method of claim 78, wherein after the first body and the second body are bonded together, the first circuitry and the second circuitry are electrically connected via solder bumps.

80. A method for magnetically-directed, self-assembling parts, comprising:

providing a first body, the first body exhibiting a first magnetic field having a first predetermined pattern; and providing a second body, the second body exhibiting a second magnetic field having a second predetermined pattern, wherein the first body and the second body are fully aligned to each other and bonded together by a magnetic attraction force between the first body and the second body due to the first and second magnetic fields when the magnetic attraction force between the first body and the second body is sufficient to overcome a mixing force, and mixing the first body with the second body with the mixing force, wherein the first body and the second body are fully aligned to each other and bonded together by a magnetic attraction force between the first body and the second body when the magnetic attraction force between the first body and the second body is sufficient to overcome the mixing force, wherein the mixing force is higher than any magnetic attraction force between the second body and another second body.

\* \* \* \* \*

UNITED STATES PATENT AND TRADEMARK OFFICE
CERTIFICATE OF CORRECTION

PATENT NO.        : 8,138,868 B2                                              Page 1 of 1
APPLICATION NO.   : 12/102758
DATED             : March 20, 2012
INVENTOR(S)       : David P. Arnold It is certified that error appears in the above-identified patent and that said Letters Patent is hereby corrected as shown below:

Column 15,
Line 46, "of the of the first" should read --of the first--.

Column 19,
Line 26, "of the of the first" should read --of the first--.

Signed and Sealed this
Twenty-ninth Day of May, 2012

David J. Kappos
*Director of the United States Patent and Trademark Office*